United States Patent
Wei et al.

(10) Patent No.: US 11,335,414 B2
(45) Date of Patent: May 17, 2022

(54) METHOD OF DETERMINING READ REFERENCE VOLTAGE FOR BLOCKS BASED ON NUMBER OF ERRONEOUS BITS

(71) Applicant: INNOGRIT TECHNOLOGIES CO., LTD, Shanghai (CN)

(72) Inventors: Tao Wei, Shanghai (CN); Zhengtian Feng, Shanghai (CN); Ke Wei, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 16/858,256

(22) Filed: Apr. 24, 2020

(65) Prior Publication Data

US 2021/0020251 A1    Jan. 21, 2021

(30) Foreign Application Priority Data

Jul. 17, 2019   (CN) .......................... 201910645148.3

(51) Int. Cl.

| | |
|---|---|
| *G11C 7/12* | (2006.01) |
| *G11C 16/28* | (2006.01) |
| *G11C 16/34* | (2006.01) |
| *G01R 19/165* | (2006.01) |
| *G11C 16/26* | (2006.01) |
| *G11C 29/02* | (2006.01) |
| *G11C 11/56* | (2006.01) |

(52) U.S. Cl.
CPC ........ *G11C 16/28* (2013.01); *G01R 19/16566* (2013.01); *G11C 16/26* (2013.01); *G11C 16/34* (2013.01); *G11C 29/028* (2013.01); *G11C 11/5642* (2013.01)

(58) Field of Classification Search
CPC .. G11C 7/14; G11C 7/22; G11C 16/26; G11C 16/28; G11C 16/3404; G11C 16/0483
See application file for complete search history.

(56) References Cited

U.S. PATENT DOCUMENTS

| | | | | |
|---|---|---|---|---|
| 9,563,502 | B1 * | 2/2017 | Alhussien | ........... G06F 11/1048 |
| 9,620,202 | B2 * | 4/2017 | Chen | ................... G06F 11/1402 |
| 10,748,599 | B1 * | 8/2020 | Hsiao | ................. G11C 16/3459 |

(Continued)

FOREIGN PATENT DOCUMENTS

WO    WO-2018119900 A1 *   7/2018   .............. G06F 11/00

*Primary Examiner* — Mushfique Siddique
(74) *Attorney, Agent, or Firm* — Womble Bond Dickinson (US) LLP

(57) ABSTRACT

A method and apparatus for determining a reference voltage id disclosed. The method may include: reading data from a first flash memory page by using different reference voltages, and taking, as a first target reference voltage, one of the different reference voltages at which the first number of erroneous bits of the data that is read reaches a converegence value. The first flash memory page is any one of multiple flash memory pages of a flash memory block to be tested. The method may include adjusting the first target reference voltage to obtain second target reference voltages; and reading data from the flash memory pages by using the second target referece voltages, and taking, as a target reference voltage, one of the second target reference voltages at which the second number of erroneous bits of the data that is read is the smallest.

17 Claims, 4 Drawing Sheets

(56) References Cited

U.S. PATENT DOCUMENTS

| | | | |
|---|---|---|---|
| 2015/0006983 A1* | 1/2015 | Lin | G11C 16/26 714/721 |
| 2017/0125111 A1* | 5/2017 | Sankaranarayanan | G06F 11/0793 |
| 2018/0068736 A1* | 3/2018 | Kim | G11C 29/028 |
| 2019/0243734 A1* | 8/2019 | Kim | G06F 12/0246 |

* cited by examiner

METHOD OF DETERMINING READ REFERENCE VOLTAGE FOR BLOCKS BASED ON NUMBER OF ERRONEOUS BITS

TECHNICAL FIELD

The present disclosure relates to the technical field of integrated circuits, in particular, to a method and apparatus for determining a reference voltage.

BACKGROUND

Solid state drives (SSDs) use NAND (NAND) flash memory particles as storage media for data storage. The NAND memory consists of multiple storage units. Generally, the reference voltage in the factory settings can be applied to the storage unit in order to read data stored in the storage unit. In practical applications, however, the actual reference voltage corresponding to each data state would deviate from the reference voltage in the factory settings due to NAND read and write operations, erase and write operations, data retention time, use time, etc., which might lead to errors in data reading.

SUMMARY

In view of the above, according to one aspect of the present disclosure, there is provided a method for determining a reference voltage, which may comprise:

reading data from a first flash memory page by using a plurality of different reference voltages, and taking, as a first target reference voltage, one of the plurality of different reference voltages at which the first number of erroneous bits of the data that is read reaches a convergence value, wherein the first flash memory page is any one of a plurality of flash memory pages of a flash memory block to be tested;

adjusting the first target reference voltage to obtain a plurality of second target reference voltages; and reading data from the plurality of flash memory pages of the flash memory block by using the plurality of second target reference voltages, and taking, as a target reference voltage, one of the plurality of second target reference voltages at which the second number of erroneous bits of the data that is read is the smallest.

In a possible implementation, the method may further comprise:

gradually adjusting a preset reference voltage by a first step size to obtain the plurality of different reference voltages, wherein the first number of erroneous bits of the data that is read by using the reference voltage obtained after each time of the adjusting gradually decreases.

In a possible implementation, gradually adjusting a preset reference voltage by a first step size to obtain the plurality of different reference voltages may comprise:

adjusting the preset reference voltage upward and downward by the first step size to obtain a first reference voltage and a second reference voltage, respectively;

comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;

determining an adjustment direction according to a smaller one of the number of erroneous bits corresponding to the first reference voltage and the number of erroneous bits corresponding to the second reference voltage, as compared with the number of erroneous bits corresponding to the preset reference voltage; and gradually adjusting the first reference voltage or the second reference voltage in the adjustment direction by the first step size to obtain the plurality of different reference voltages.

In a possible implementation, the method may further comprise:

adjusting the first step size according to the number of erroneous bits of the data that is read by using the reference voltage obtained after each time of the adjusting, and the previous number of erroneous bits.

In a possible implementation, adjusting the first step size according to the number of erroneous bits of the data that is read by using the reference voltage obtained after each time of the adjusting, and the previous number of erroneous bits may comprise:

increasing the first step size when the number of erroneous bits of the data that is read by using the reference voltage obtained after the adjusting is smaller than the previous number of erroneous bits; or changing the adjustment direction and decreasing the first step size when the number of erroneous bits of the data that is read by using the reference voltage obtained after the adjusting is greater than the previous number of erroneous bits.

In a possible implementation, more than one of the preset reference voltage are provided.

In a possible implementation, adjusting the first target reference voltage to obtain a plurality of second target reference voltages may comprise:

halving a second step size in sequence and rounding results of the halving to obtain a plurality of third step sizes; and adjusting the first target reference voltage upward and downward by using the second step size and the plurality of third step sizes to obtain the plurality of second target reference voltages.

In a possible implementation, reading data from the plurality of flash memory pages of the flash memory block by using the plurality of second target reference voltages, and taking, as a target reference voltage, one of the plurality of second target reference voltages at which the second number of erroneous bits of the data that is read is the smallest comprise:

taking, as an intermediate result of a smallest value, the second number of erroneous bits of the data that is read by using a first one of the plurality of second target reference voltages; and updating the intermediate result of the smallest value by using the second number of erroneous bits of the data that is read by using a current second target reference voltage, when the second number of erroneous bits of the data that is read by using any one of the plurality of second target reference voltages is smaller than the intermediate result of the smallest value.

In a possible implementation, the method may further comprise:

when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

According to another aspect of the present disclosure, there is provided an apparatus for determining a reference voltage, which may comprise:

a first determination module configured to read data from a first flash memory page by using a plurality of different reference voltages, and to take, as a first target reference voltage, one of the plurality of different reference voltages at which the first number of erroneous bits of the data that is read reaches a convergence value, wherein the first flash memory page is any one of a plurality of flash memory pages of a flash memory block to be tested;

an adjustment module connected to the first determination module, wherein the adjustment module is configure to adjust the first target reference voltage to obtain a plurality of second target reference voltages; and a second determination module connected to the adjustment module, wherein the second determination module is configured to read data from the plurality of flash memory pages of the flash memory block by using the plurality of second target reference voltages, and to take, as a target reference voltage, one of the plurality of second target reference voltages at which the second number of erroneous bits of the data that is read is the smallest.

In a possible implementation, the apparatus may further comprise:

a third determination module connected to the first determination module, wherein the third determination module is configured to gradually adjust a preset reference voltage by a first step size to obtain the plurality of different reference voltages, wherein the first number of erroneous bits of the data that is read by using the reference voltages obtained after each time of the adjusting gradually decreases.

In a possible implementation, gradually adjusting a preset reference voltage by a first step size to obtain the plurality of different reference voltages may comprise:

adjusting the preset reference voltage upward and downward by the first step size to obtain a first reference voltage and a second reference voltage, respectively;

comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;

determining an adjustment direction according to a smaller one of the number of erroneous bits corresponding to the first reference voltage and the number of erroneous bits corresponding to the second reference voltage, as compared with the number of erroneous bits corresponding to the preset reference voltage; and gradually adjusting the first reference voltage or the second reference voltage in the adjustment direction by the first step size to obtain the plurality of different reference voltages.

In a possible implementation, the third determination module may comprise:

a step size adjustment submodule configured to adjust the first step size according to the number of erroneous bits of the data that is read by using the reference voltage obtained after each time of the adjusting, and the previous number of erroneous bits.

In a possible implementation, adjusting the first step size according to the number of erroneous bits of the data that is read by using the reference voltage obtained after each time of the adjusting, and the previous number of erroneous bits may comprise:

increasing the first step size when the number of erroneous bits of the data that is read by using the reference voltage obtained after the adjusting is smaller than the previous number of erroneous bits; or changing the adjustment direction and decreasing the first step size when the number of erroneous bits of the data that is read by using the reference voltage obtained after the adjusting is greater than the previous number of erroneous bits.

In a possible implementation, more than one of the preset reference voltage are provided.

In a possible implementation, adjusting the first target reference voltage to obtain a plurality of second target reference voltages may comprise:

halving a second step size in sequence and rounding results of the halving to obtain a plurality of third step sizes; and adjusting the first target reference voltage upward and downward using the second step size and the plurality of third step sizes to obtain the plurality of second target reference voltages.

In a possible implementation, reading data from the plurality of flash memory pages of the flash memory block by using the plurality of second target reference voltages, and taking, as a target reference voltage, one of the plurality of second target reference voltages at which the second number of erroneous bits of the data that is read is the smallest comprise:

taking, as an intermediate result of a smallest value, the second number of erroneous bits of the data that is read by using a first one of the plurality of second target reference voltages; and updating the intermediate result of the smallest value by using the second number of erroneous bits of the data that is read by using a current second target reference voltage, when the second number of erroneous bits of the data that is read by using any one of the plurality of second target reference voltages is smaller than the intermediate result of the smallest value.

In a possible implementation, the apparatus may further comprise:

when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

According to still another aspect of the present disclosure, there is provided an apparatus for determining a reference voltage, which may comprise: a processor; and a memory for storing processor-executable instructions, wherein the processor is configured to perform the method described above.

According to yet another aspect of the present disclosure, there is provided a non-transitory computer-readable medium storing computer program instructions, wherein the method described above is implemented when the computer program instructions are executed by a processor.

By the methods and apparatuses described above, the present disclosure can determine a first target reference voltage of a first flash memory page, obtain a plurality of second target reference voltages by using the first target voltage, and obtain a target reference voltage suitable for a flash memory block by using the plurality of second target reference voltages. By the methods described above, the present disclosure can determine a current actual reference voltage of a flash memory block, thereby the flash memory block may operate normally and the data may be accurately read.

Other features and aspects of the present disclosure will be clearer from the following detailed description of exemplary embodiments with reference to the drawings.

BRIEF DESCRIPTION OF THE DRAWINGS

The drawings, which are incorporated in and constitute part of the specification, together with the description, illustrate exemplary embodiments, features, and aspects of the present disclosure and serve to explain the spirit of the present disclosure.

DETAILED DESCRIPTION

Figure 1:
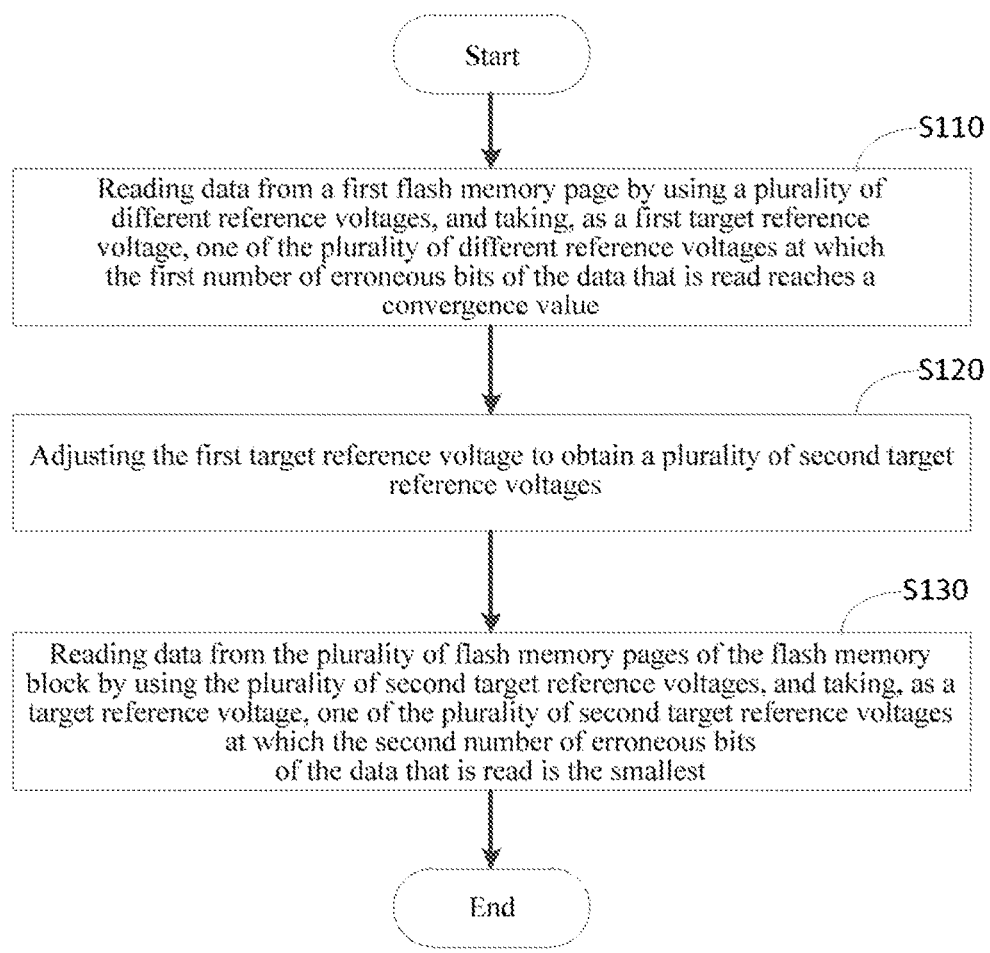
FIG. 1 shows a flowchart of a method for determining a reference voltage according to an implementation of the present disclosure.

Various exemplary embodiments, features, and aspects of the present disclosure will be described in detail with reference to the drawings. The same reference numerals in the drawings represent elements having the same or similar functions. Although various aspects of the embodiments are shown in the drawings, it is unnecessary to proportionally draw the drawings unless otherwise specified.

Herein the term "exemplary" means "used as an instance or embodiment, or explanatory." An "exemplary" embodiment given here is not necessarily construed as being superior to or better than other embodiments.

Numerous details are given in the following detailed implementations for the purpose of better explaining the present disclosure. It should be understood by a person of ordinary skill in the art that the present disclosure can still be realized even without some of those details. In some of the embodiments, methods, means, elements and circuits that are well known to a person of ordinary skill in the art are not described in detail so that the spirit of the present disclosure become apparent.

Please refer to FIG. 1, which shows a flowchart of a method for determining a reference voltage according to an implementation of the present disclosure.

As shown in FIG. 1, the method may comprise:

step S110 of reading data from a first flash memory page by using a plurality of different reference voltages, and taking, as a first target reference voltage, one of the plurality of different reference voltages at which the first number of erroneous bits of the data that is read reaches a convergence value, wherein the first flash memory page is any one of a plurality of flash memory pages of a flash memory block to be tested;

step S120 of adjusting the first target reference voltage to obtain a plurality of second target reference voltages; and step S130 of reading data from the plurality of flash memory pages of the flash memory block by using the plurality of second target reference voltages, and taking, as a target reference voltage, one of the plurality of second target reference voltages at which the second number of erroneous bits of the data that is read is the smallest.

By the method described above, the present disclosure can determine a first target reference voltage of a first flash memory page, obtain a plurality of second target reference voltages by using the first target voltage, and obtain a target reference voltage suitable for a flash memory block by using the plurality of second target reference voltages. By the method described above, the present disclosure can determine a current actual reference voltage of a flash memory block, thereby the flash memory block may operate normally and the data may be accurately read.

In a possible implementation, the convergence value may be determined depending on actual circumstances. The present disclosure does not limit the specific value of the convergence value.

The storage units included in an NAND memory can be categorized into several types according to the different NAND types. The several types includes for example, the Single-Level Cell (SLC), Multi-Level Cell (MLC), and Triple-Level Cell (TLC), which can store 1 bit of data, 2 bits of data, and 3 bits of data per cell.

Take the TLC for example. Please refer to FIG. 2, which shows a schematic diagram of data stored in the TLC storage unit in an NAND memory.

Figure 2:
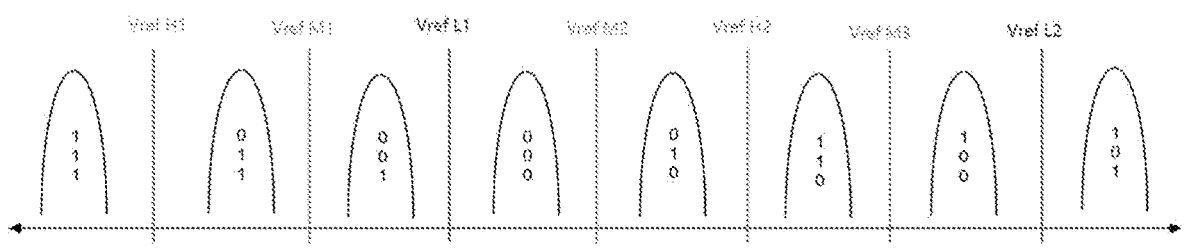
FIG. 2 shows a schematic diagram of data stored in the triple-level cell (TLC) storage unit in an NAND memory.

As shown in FIG. 2, the TLC can store 3 bits of data (high-order bit, medium-order bit, low-order bit), so data stored therein can have eight data states (that is, eight types of data information): 000, 001, 010, 011, 100, 101, 110, and 111. The eight data states correspond to different reference voltages: Vref H1, Vref M1, Vref L1, Vref M2, Vref H2, Vref M3, and Vref L2. When the high-order bit of data, the medium-order bit of data, or the low-order bit of data is to be read, the corresponding reference voltage is applied to the storage unit.

Figure 3:
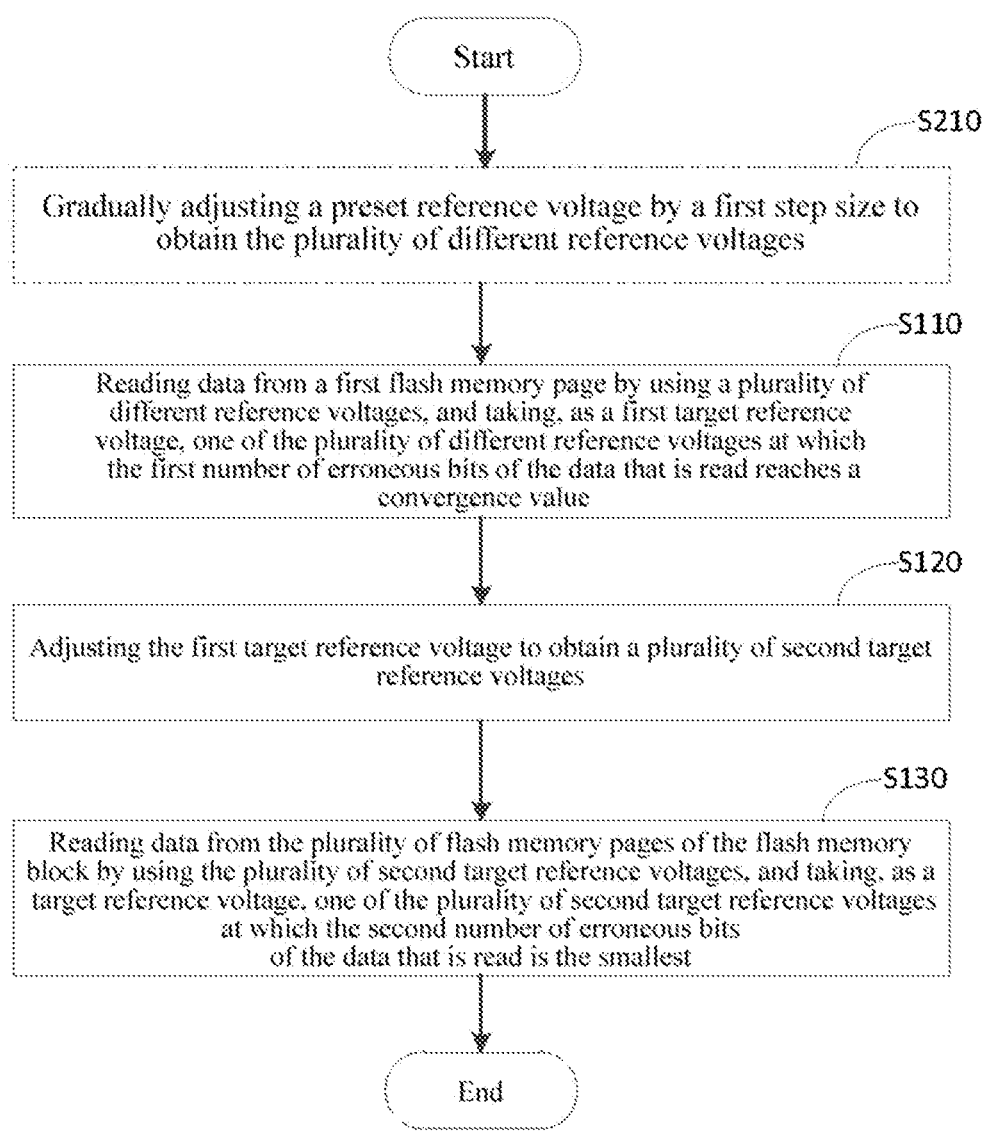
FIG. 3 shows a flowchart of a method for determining a reference voltage according to an implementation of the present disclosure.

Please refer to FIG. 3, which shows a flowchart of a method for determining a reference voltage according to an implementation of the present disclosure.

In a possible implementation, as shown in FIG. 3, the method may further comprise:

step S210 of gradually adjusting a preset reference voltage by a first step size to obtain the plurality of different reference voltages, wherein the first number of erroneous bits of the data that is read by using the reference voltage obtained after each time of the adjusting gradually decreases.

In a possible implementation, taking the TLC for example, the preset reference voltage may be one of Vref H1, Vref M1, Vref L1, Vref M2, Vref H2, Vref M3, and Vref L2. In a storage unit of other type, other reference voltage may be selected as the preset reference voltage.

In a possible implementation, the first step size may be set as required. The present disclosure does not limit the first step size.

In one example, the first step size may be a fixed value, e.g., in unit of 1.

In other examples, the first step size may be a varied value adding one unit after each calculation, for example, 1, 2, 3, 4, . . . , and so on; or exponentially increasing after each calculation, for example, 1, 2, 4, 8, . . . , and so on.

It should be noted that the first step size can be converted into a voltage value. The conversion method may vary depending on the type of the SSD. For example, the first step size of "one" means that the corresponding voltage may be 0.01 V, 0.02 V, etc. The present disclosure does not limit the specific correspondence between the first step size and the voltage, and it may be decided by a person of ordinary skill in the art depending on actual circumstances.

In a possible implementation, gradually adjusting a preset reference voltage by a first step size to obtain the plurality of different reference voltages may comprise:

adjusting the preset reference voltage upward and downward by the first step size to obtain a first reference voltage and a second reference voltage, respectively;

comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;

determining an adjustment direction according to a smaller one of the number of erroneous bits corresponding to the first reference voltage and the number of erroneous bits corresponding to the second reference voltage, as compared with the number of erroneous bits corresponding to the preset reference voltage; and gradually adjusting the first reference voltage or the second reference voltage in the adjustment direction by the first step size to obtain the plurality of different reference voltages.

In a possible implementation, a flash memory block for which a target reference voltage needs to be determined may be erased in advance, and known data is written into the flash memory block.

In one example, the known data written into the flash memory block maybe random data in which zeros and ones are equalized.

In one example, if there is a need to adjust the reference voltage (e.g., Vref L1) at which lower page data is read in order to determine the actual reference voltage for the lower page data, suppose that the first step size is one (which is converted to the voltage value of 0.02 V) and suppose that Vref L1 is 2 V, then, it can be obtained that the first reference voltage is 2.02 V, and the second reference voltage is 1.98 V, according to "adjusting the preset reference voltage upward and downward by the first step size to obtain a first reference voltage and a second reference voltage, respectively".

Comparing the data from the first flash memory page that is read by using Vref L1, the first reference voltage, and the second reference voltage, respectively, with known preset data, respectively, the number of erroneous bits corresponding to the preset reference voltage, the number of erroneous bits corresponding to the first reference voltage, and the number of erroneous bits corresponding to the second reference voltage may be obtained, respectively.

In a possible implementation, comparing the data read from the first flash memory page with preset data may be performed by using software methods or by hardware. The present disclosure does not limit the specific implementation to do the data comparison.

The range of the adjustment can be narrowed down by determining a direction of the smaller one of the numbers of erroneous bits corresponding to the first reference voltage and the second reference voltage compared with the number of erroneous bits corresponding to Vref L1 as the adjustment direction.

In one example, suppose that the number of erroneous bits corresponding to the first reference voltage (2.02 V) is smaller. Then, it can be determined that the adjustment direction is upward.

In one example, the different voltages obtained according to "gradually adjusting the first reference voltage or the second reference voltage in the adjustment direction by the first step size to obtain the plurality of different reference voltages" may include 2.02 V, 2.04 V, 2.06 V, 2.08 V, and so on.

By the method described above, the present disclosure can obtain a plurality of different reference voltages according to a preset reference voltage and a preset step size.

By the method described above, a plurality of different reference voltages can be obtained. After a plurality of different reference voltages are obtained, according to step S110, data from the first flash memory page may be read by using the obtained plurality of different reference voltages, the first numbers of erroneous bits corresponding to each different reference voltages are determined by comparing the read data with preset data, and the reference voltage at which the first number of erroneous bits of the data that is read reaches a convergence value is taken as the first target reference voltage.

In a possible implementation, in the process of reading the data from the first flash memory page by using the reference voltage and comparing the data with the preset data to obtain the first number of erroneous bits, the reference voltage may also be dynamically adjusted by, for example, adjusting the first step size.

In a possible implementation, the method may further comprise:

adjusting the first step size according to the number of erroneous bits of the data that is read by using the reference voltage obtained after each time of the adjusting, and the previous number of erroneous bits.

In a possible implementation, adjusting the first step size according to the number of erroneous bits of the data that is read by using the reference voltage obtained after each time of the adjusting, and the previous number of erroneous bits may comprise:

increasing the first step size when the number of erroneous bits of the data that is read by using the reference voltage obtained after the adjusting is smaller than the previous number of erroneous bits; or changing the adjustment direction and decreasing the first step size when the number of erroneous bits of the data that is read by using the reference voltage obtained after the adjusting is greater than the previous number of erroneous bits.

In one example, if the number of erroneous bits is getting smaller, the first step size may be gradually increased. For example, the first step size may be gradually increased from 1 to 2, 3, 4, 5, and so on.

Gradually increasing the first step size can thus speed up the calculation, thereby saving computing resources and costs.

If the number of erroneous bits of the data that is read by using the reference voltage obtained after the adjusting is greater than the previous number of erroneous bits, it indicates that the actual reference voltage is between the current reference voltage and the previous reference voltage.

In this case, the adjustment direction can be changed from upward (increase) to downward (decrease), and the first step size can be reduced.

In one example, suppose that the current reference voltage is 2.26 V, the previous reference voltage is 2.2 V, and the current first step size is three (corresponding to 0.06 V). Then, it can be determined that the actual reference voltage is between 2.2 V and 2.26 V Therefore, the reference voltage may be adjusted downward from the current reference voltage of 2.26 V, and the step size may be reduced to two (corresponding to 0.02 V). In this way, the obtained adjusted reference voltage is 2.22 V (2.26 V-0.04 V). The adjusted reference voltage of 2.22 V is used for the next reading and calculation.

Repeating the process described above will eventually result in a reference voltage at which the first number of erroneous bits reaches a convergence value, that is, the first target reference voltage.

In a possible implementation, step S120 of adjusting the first target reference voltage to obtain a plurality of second target reference voltages may comprise:

halving a second step size in sequence and rounding results of the halving to obtain a plurality of third step sizes; and adjusting the first target reference voltage upward and downward by using the second step size and the plurality of third step sizes to obtain the plurality of second target reference voltages.

In a possible implementation, the rounding may be rounding up or down. Rounding down will be described now as an example. In a possible implementation, the second step size may be different from the first step size and be determined based on needs. The present disclosure does not limit the second step size.

In one example, suppose that the second step size is 10. Then, "halving a second step size in sequence and rounding results of the halving to obtain a plurality of third step sizes" may result in the plurality of third step sizes of 5, 2, 1, and 0. The voltages corresponding to the second step size and the plurality of third step sizes may be 0.2 V, 0.1 V, 0.04 V, 0.02 V, and 0 by following the hypothetical convertion relation that the step size of one unit corresponds to the voltage of 0.02 V.

In a possible implementation, "adjusting the first target reference voltage upward and downward by the second step size and the plurality of third step sizes to obtain the plurality of second target reference voltages" may be based on the immediate proceeding second target reference voltage. For example, suppose that the first target reference voltage is 3.6 V. Then, the plurality of second target reference voltages may be 3.6+/−0.2 V (3.8 V, 3.4 V), based on 3.6 V; 3.8 V+/−0.1 V (3.9 V, 3.7 V), based on 3.8V; 3.4 V+/−0.1 V (3.5 V, 3.3 V), based on 3.4 V; and the like.

Figure 4:
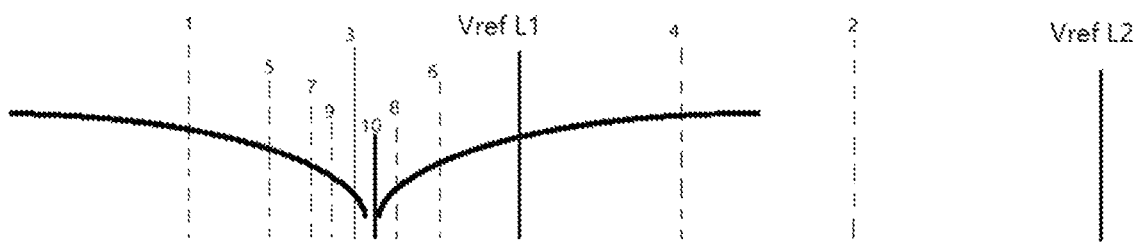
FIG. 4 shows a schematic diagram of determining a plurality of second target reference voltages according to the present disclosure.

Please refer to FIG. 4, which shows a schematic diagram of determining a plurality of second target reference voltages according to the present disclosure.

Suppose that Vref L1 is the first target reference voltage (and the other preset reference voltages, e.g., Vref L2, are fixed). Adjusting Vref L1 upward and downward several times may result in a plurality of second target reference voltages (dotted lines 1-10). Apparently, FIG. 4 only shows a part of the second target reference voltages (dotted lines 2 and 4) obtained by the upward adjustment. As for the others, it can be known from the mirroring principle that they correspond to those second reference voltages obtained by the downward adjustment, which are dotted lines 1, 3, 5, 6, 7, 8, 9, and 10.

By the method described above, the present disclosure can determine a plurality of second target reference voltages according to the first target reference voltage.

After a plurality of second target reference voltages are obtained, it is possible to determine the actual target reference voltages for a plurality of flash memory pages of the flash memory block from the plurality of second target reference voltages.

In a possible implementation, step S130 of reading data from the plurality of flash memory pages of the flash memory block by using the plurality of second target reference voltages, and taking, as a target reference voltage, one of the plurality of second target reference voltages at which the second number of erroneous bits of the data that is read is the smallest may comprise:

taking, as an intermediate result of a smallest value, the second number of erroneous bits of the data that is read by using a first one of the plurality of second target reference voltages; and updating the intermediate result of the smallest value by using the second number of erroneous bits of the data that is read by using a current one of the plurality of second target reference voltages, when the second number of erroneous bits of the data that is read by using any one of the plurality of second target reference voltages is smaller than the intermediate result of the smallest value.

In one example, the first one of the plurality of second target reference voltages may be a reference voltage that is the first one selected for reading data from the plurality of flash memory pages of the flash memory block among the plurality of second target reference voltages and used for comparison. The selection may be performed in a random way or in the order of generating the second target reference voltages. The present disclosure does not limit how the selection is performed.

For example, suppose that the second target reference voltages obtained from step S120 include 3.6 V, 3.8 V, and 3.9 V. Then, one of the three second target reference voltages may be randomly selected as the first one of the second target reference voltages, or 3.6 V (which is the first one of the generated second target reference voltages) may be selected as the first one of the second target reference voltages.

In a possible implementation, the plurality of flash memory pages of the flash memory block may refer to all the flash memory pages of the flash memory block.

Testing all the flash memory pages of the flash memory block makes it possible to obtain the actual reference voltages corresponding to all the flash memory pages of the flash memory block. The target reference voltages obtained by using the method described above make it possible to accurately read data from all the flash memory pages of the flash memory block.

In a possible implementation, the method described above may further comprise:

when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

After the intermediate result of the smallest value is determined by using the first one of the second target reference voltages, for each of the subsequent ones of the second target reference voltages, when calculating the number of erroneous bits, as the number of erroneous bits of each of the flash memory pages is being calculated, the calculated number of erroneous bits is compared with the intermediate result of the smallest value. And when the calculated number is greater than the intermediate result of the smallest value, it is time to stop calculating the number of erroneous bits of data from the remaining flash memory pages of the flash memory block by using the current one of the second target reference voltages.

This approach may reduce the amount of the calculation and improve its efficiency.

In one example, suppose that the flash memory block includes M flash pages. Then, when it is found that the numbers of erroneous bits of data from N (N<M) flash pages is greater than the intermediate result of the smallest value, stop calculating the number of erroneous bits of data from the remaining M-N flash pages.

Apparently, in other implementations, a person skilled in the art may choose to perform the comparison after data from all the flash memory pages is read. The present disclosure does not limit when to perform the comparison.

It should be understood that what is described above concerns the adjustment and determination of one reference voltage of a storage unit of the NAND memory. As described above, the number of reference voltages of the storage units of the NAND memory varies based on the type of the storage units—the number of reference voltages may be more than one. Certainly, the other reference voltages may be determined by the method described above similarly, and the detail is omitted here.

By the method described above, the present disclosure can determine the actual reference voltage of an SSD when its preset reference voltage deviates, and thus can enable normal operating of the SSD and accurate reading of data stored therein.

Figure 5:
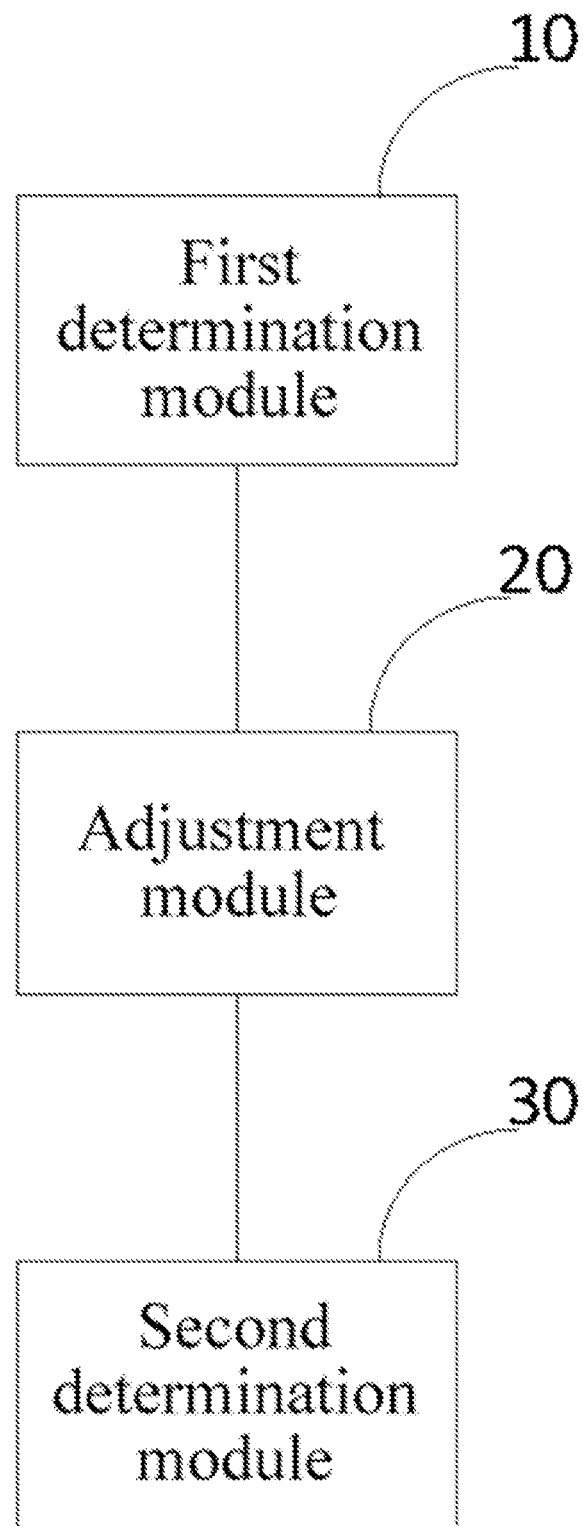
FIG. 5 illustrates a block diagram of an apparatus for determining a reference voltage according to an implementation of the present disclosure.

Please refer to FIG. 5 which illustrates a block diagram of an apparatus for determining a reference voltage according to an implementation of the present disclosure.

As shown in FIG. 5, the apparatus may comprise:

a first determination module configured to read data from a first flash memory page by using a plurality of different reference voltages, and to take, as a first target reference voltage, one of the plurality of different reference voltages at which the first number of erroneous bits of the data that is read reaches a convergence value, wherein the first flash memory page is any one of a plurality of flash memory pages of a flash memory block to be tested;

an adjustment module connected to the first determination module, wherein the adjustment module is configured to adjust the first target reference voltage to obtain a plurality of second target reference voltages; and a second determination module connected to the adjustment module, wherein the second determination module is configured to read data from the plurality of flash memory pages of the flash memory block by using the plurality of second target reference voltages, and to take, as a target reference voltage, one of the plurality of second target reference voltages at which the second number of erroneous bits of the data that is read is the smallest.

By the apparatus described above, the present disclosure can determine a first target reference voltage of a first flash memory page, obtain a plurality of second target reference voltages by using the first target voltage, and obtain a target reference voltage suitable for a flash memory block by using the plurality of second target reference voltages. By the apparatus described above, the present disclosure can determine a current actual reference voltage of a flash memory block, thereby the flash memory block may operate normally and the data may be accurately read.

Figure 6:
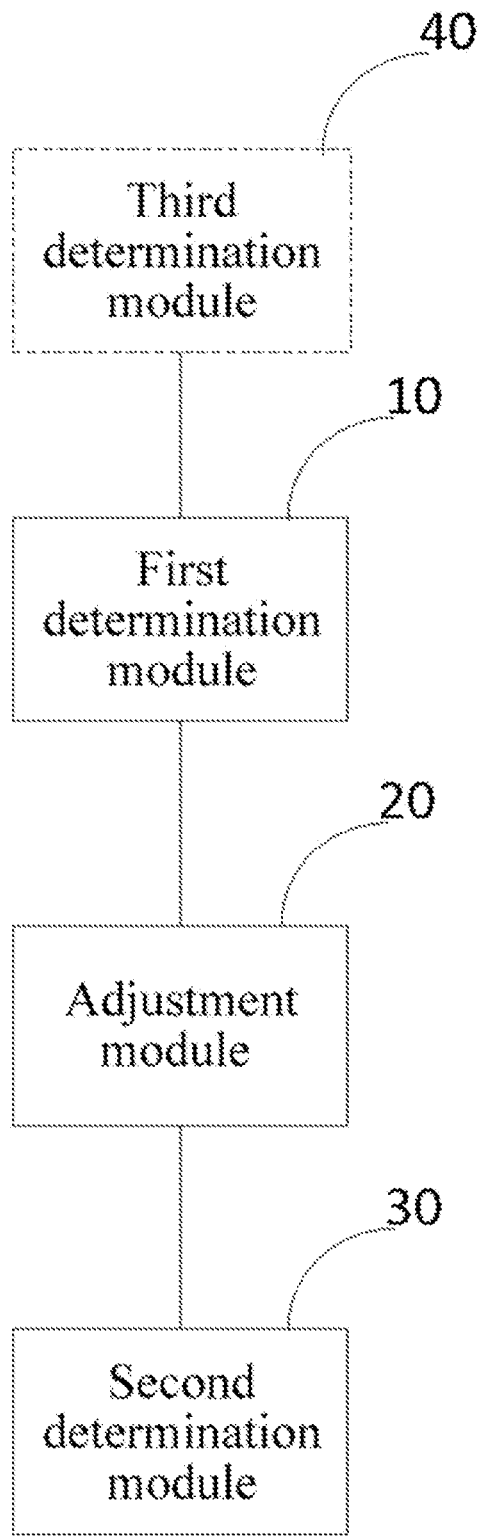
FIG. 6 illustrates a block diagram of an apparatus for determining a reference voltage according to an implementation of the present disclosure.

Please refer to FIG. 6 which illustrates a block diagram of an apparatus for determining a reference voltage according to an implementation of the present disclosure.

In a possible implementation, as shown in FIG. 6, the apparatus may comprise:

a third determination module connected to the first determination module, wherein the third determination module is configured to gradually adjust a preset reference voltage by a first step size to obtain the plurality of different reference voltages, wherein the first number of erroneous bits of the data that is read by using the reference voltage obtained after each time of the adjusting gradually decreases.

In a possible implementation, gradually adjusting a preset reference voltage by a first step size to obtain the plurality of different reference voltages may comprise:

adjusting the preset reference voltage upward and downward by the first step size to obtain a first reference voltage and a second reference voltage, respectively;

comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;

determining an adjustment direction according to a smaller one of the number of erroneous bits corresponding to the first reference voltage and the number of erroneous bits corresponding to the second reference voltage, as compared with the number of erroneous bits corresponding to the preset reference voltage; and gradually adjusting the first reference voltage or the second reference voltage in the adjustment direction by the first step size to obtain the plurality of different reference voltages.

In a possible implementation, the third determination module may comprise:

a step size adjustment submodule configured to adjust the first step size according to the number of erroneous bits of the data that is read by using the reference voltage obtained after each time of the adjustment, and the previous number of erroneous bits.

In a possible implementation, adjusting the first step size according to the number of erroneous bits of the data that is read by using the reference voltage obtained after each time of the adjusting, and the previous number of erroneous bits may comprise:

increasing the first step size when the number of erroneous bits of the data that is read by using the reference voltage obtained after the adjusting is smaller than the previous number of erroneous bits; or changing the adjustment direction and decreasing the first step size when the number of erroneous bits of the data that is read by using the reference voltage obtained after the adjusting is greater than the previous number of erroneous bits.

In a possible implementation, more than one of the preset reference voltage are provided.

In a possible implementation, adjusting the first target reference voltage to obtain a plurality of second target reference voltages may comprise:

halving a second step size in sequence and rounding results of the halving to obtain a plurality of third step sizes; and adjusting the first target reference voltage upward and downward using the second step size and the plurality of third step sizes to obtain the plurality of second target reference voltages.

In a possible implementation, reading data from the plurality of flash memory pages of the flash memory block by using the plurality of second target reference voltages, and taking, as a target reference voltage, one of the plurality of second target reference voltages at which the second number of erroneous bits of the data that is read is the smallest may comprise:

taking, as an intermediate result of a smallest value, the second number of erroneous bits of the data that is read by using a first one of the plurality of second target reference voltages; and updating the intermediate result of the smallest value by using the second number of erroneous bits of the data that is read by using a current one of the plurality of second target reference voltages, when the second number of erroneous bits of the data that is read by using any one of the plurality of second target reference voltages is smaller than the intermediate result of the smallest value.

In a possible implementation, the apparatus may further comprise:

when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

The embodiments of the present disclosure have been described above, but they are merely exemplary, not exhaustive, and the present disclosure is not limited to them. A number of variations and modifications that do not depart from the scopes and spirits of the embodiments described above are obvious to a person of ordinary skill in the art. The terms in the present disclosure are selected to provide the best explanation of the spirit and practical applications of the embodiments and the improvements on the technologies on the market, or to make the embodiments understandable to others of ordinary skill in the art.

What is claimed is:

1. A method for determining a reference voltage, which comprises:

reading data from a first flash memory page by using a plurality of different reference voltages, and taking, as a first target reference voltage, one of the plurality of different reference voltages at which a first number of erroneous bits of the data that is read reaches a convergence value, wherein the first flash memory page is any one of a plurality of flash memory pages of a flash memory block to be tested;

adjusting the first target reference voltage to obtain a plurality of second target reference voltages by: halving a second step size in sequence and rounding results of the halving to obtain a plurality of third step sizes, and adjusting the first target reference voltage upward and downward by using the second step size and the plurality of third step sizes to obtain the plurality of second target reference voltages;

reading data from the plurality of flash memory pages of the flash memory block by using the plurality of second target reference voltages, and taking, as a target reference voltage, one of the plurality of second target reference voltages at which a second number of erroneous bits of the data that is read is the smallest; and gradually adjusting at least one of a plurality of preset reference voltages by a first step size to obtain the plurality of different reference voltages, wherein more than one of the preset reference voltages are provided.

2. The method according to claim 1, wherein the first number of erroneous bits of the data that is read by using the reference voltage obtained after each time of the adjusting gradually decreases.

3. The method according to claim 2, wherein gradually adjusting a preset reference voltage by a first step size to obtain the plurality of different reference voltages comprises:

adjusting the preset reference voltage upward and downward by the first step size to obtain a first reference voltage and a second reference voltage, respectively;

comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;

determining an adjustment direction according to a smaller one of the number of erroneous bits corresponding to the first reference voltage and the number of erroneous bits corresponding to the second reference voltage, as compared with the number of erroneous bits corresponding to the preset reference voltage; and gradually adjusting the first reference voltage or the second reference voltage in the adjustment direction by the first step size to obtain the plurality of different reference voltages.

4. The method according to claim 2, which further comprises:

adjusting the first step size according to the number of erroneous bits of the data that is read by using the reference voltage obtained after each time of the adjusting, and a previous number of erroneous bits.

5. The method according to claim 4, wherein adjusting the first step size according to the number of erroneous bits of the data that is read by using the reference voltage obtained after each time of the adjusting, and the previous number of erroneous bits comprises:

increasing the first step size when the number of erroneous bits of the data that is read by using the reference voltage obtained after the adjusting is smaller than the previous number of erroneous bits; or changing an adjustment direction and decreasing the first step size when the number of erroneous bits of the data that is read by using the reference voltage obtained after the adjusting is greater than the previous number of erroneous bits.

6. The method according to claim 1, wherein reading data from the plurality of flash memory pages of the flash memory block by using the plurality of second target reference voltages, and taking, as a target reference voltage, one of the plurality of second target reference voltages at which the second number of erroneous bits of the data that is read is the smallest comprise:

taking, as an intermediate result of a smallest value, the second number of erroneous bits of the data that is read by using a first one of the plurality of second target reference voltages; and updating the intermediate result of the smallest value by using the second number of erroneous bits of the data that is read by using a current one of the plurality of second target reference voltages, when the second number of erroneous bits of the data that is read by using any one of the plurality of second target reference voltages is smaller than the intermediate result of the smallest value.

7. The method according to claim 6, which further comprises:
when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

8. A non-transitory computer-readable medium having instructions stored therein for determining a reference voltage
which when executed by a processor, cause the processor to perform operations, the operations comprising:
reading data from a first flash memory page by using a plurality of different reference voltages, and to take, as a first target reference voltage, one of the plurality of different reference voltages at which a first number of erroneous bits of the data that is read reaches a convergence value, wherein the first flash memory page is any one of a plurality of flash memory pages of a flash memory block to be tested;
adjusting the first target reference voltage to obtain a plurality of second target reference voltages by: halving a second step size in sequence and rounding results of the halving to obtain a plurality of third step sizes, and adjusting the first target reference voltage upward and downward by using the second step size and the plurality of third step sizes to obtain the plurality of second target reference voltages;
reading data from the plurality of flash memory pages of the flash memory block by using the plurality of second target reference voltages, and to take, as a target reference voltage, one of the plurality of second target reference voltages at which a second number of erroneous bits of the data that is read is the smallest; and
gradually adjusting at least one of a plurality of preset reference voltages by a first step size to obtain the plurality of different reference voltages, wherein more than one of the preset reference voltages are provided.

9. The non-transitory computer-readable medium according to claim 8, wherein the operations further comprise: the first number of erroneous bits of the data that is read by using the reference voltage obtained after each time of the adjusting gradually decreases.

10. The non-transitory computer-readable medium according to claim 9, wherein gradually adjusting the preset reference voltage by the first step size to obtain the plurality of different reference voltages comprises:
adjusting the preset reference voltage upward and downward by the first step size to obtain a first reference voltage and a second reference voltage, respectively;
comparing the data from the first flash memory page that is read by using the preset reference voltage, the first reference voltage, and the second reference voltage, respectively, with preset data, respectively, to obtain the number of erroneous bits corresponding to the preset reference voltage, the number of erroneous bits corresponding to the first reference voltage, and the number of erroneous bits corresponding to the second reference voltage;
determining an adjustment direction based on a smaller one of the number of erroneous bits corresponding to the first reference voltage and the number of erroneous bits corresponding to the second reference voltage, as compared with the number of erroneous bits corresponding to the preset reference voltage; and
gradually adjusting the first reference voltage or the second reference voltage in the adjustment direction by the first step size to obtain the plurality of different reference voltages.

11. The non-transitory computer-readable medium according to claim 9, wherein the operations further comprise:
adjusting the first step size according to the number of erroneous bits of the data that is read by using the reference voltage obtained after each time of the adjusting, and a previous number of erroneous bits.

12. The non-transitory computer-readable medium according to claim 11, wherein adjusting the first step size according to the number of erroneous bits of the data that is read by using the reference voltage obtained after each time of the adjusting, and the previous number of erroneous bits comprises:
increasing the first step size when the number of erroneous bits of the data that is read by using the reference voltage obtained after the adjusting is smaller than the previous number of erroneous bits; or
changing an adjustment direction and decreasing the first step size when the number of erroneous bits of the data that is read by using the reference voltage obtained after the adjusting is greater than the previous number of erroneous bits.

13. The non-transitory computer-readable medium according to claim 8, wherein reading data from the plurality of flash memory pages of the flash memory block by using the plurality of second target reference voltages, and taking, as a target reference voltage, one of the plurality of second target reference voltages at which the second number of erroneous bits of the data that is read is the smallest comprise:
taking, as an intermediate result of a smallest value, the second number of erroneous bits of the data that is read by using a first one of the plurality of second target reference voltages; and
updating the intermediate result of the smallest value by using the second number of erroneous bits of the data that is read by using a current one of the plurality of second target reference voltages, when the second number of erroneous bits of the data that is read by using any one of the plurality of second target reference voltages is smaller than the intermediate result of the smallest value.

14. The non-transitory computer-readable medium according to claim 13, wherein the operations further comprise:
when the number of erroneous bits of data from a part of the plurality of flash memory pages of the flash memory block that is read by using any one of the plurality of second target reference voltages is greater than the intermediate result of the smallest value, stopping calculating the number of erroneous bits of data from the other part of the plurality of flash memory pages.

15. A method for determining a reference voltage, which comprises:

reading data from a first flash memory page by using a plurality of different reference voltages, and taking, as a first target reference voltage, one of the plurality of different reference voltages at which a first number of erroneous bits of the data that is read reaches a convergence value, wherein the first flash memory page is any one of a plurality of flash memory pages of a flash memory block to be tested;

adjusting the first target reference voltage to obtain a plurality of second target reference voltages;

reading data from the plurality of flash memory pages of the flash memory block by using the plurality of second target reference voltages, and taking, as a target reference voltage, one of the plurality of second target reference voltages at which a second number of erroneous bits of the data that is read is the smallest;

gradually adjusting at least one of a plurality of preset reference voltages by a first step size to obtain the plurality of different reference voltages, wherein more than one of the preset reference voltages are provided; and adjusting the first step size according to the number of erroneous bits of the data that is read by using the reference voltage obtained after each time of the adjusting, and a previous number of erroneous bits, wherein the first number of erroneous bits of the data that is read by using the reference voltage obtained after each time of the adjusting gradually decreases.

16. The method according to claim 15, wherein adjusting the first step size according to the number of erroneous bits of the data that is read by using the reference voltage obtained after each time of the adjusting, and the previous number of erroneous bits comprises:

increasing the first step size when the number of erroneous bits of the data that is read by using the reference voltage obtained after the adjusting is smaller than the previous number of erroneous bits; or changing an adjustment direction and decreasing the first step size when the number of erroneous bits of the data that is read by using the reference voltage obtained after the adjusting is greater than the previous number of erroneous bits.

17. The method according to claim 15, wherein adjusting the first target reference voltage to obtain a plurality of second target reference voltages comprises:

halving a second step size in sequence and rounding results of the halving to obtain a plurality of third step sizes; and adjusting the first target reference voltage upward and downward by using the second step size and the plurality of third step sizes to obtain the plurality of second target reference voltages.

* * * * *